(12) United States Patent
Okabe et al.

(10) Patent No.: US 7,789,609 B2
(45) Date of Patent: Sep. 7, 2010

(54) LID OPENING/CLOSING SYSTEM FOR CLOSED CONTAINER AND SUBSTRATE PROCESSING METHOD USING SAME

(75) Inventors: Tsutomu Okabe, Tokyo (JP); Jun Emoto, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 12/106,619

(22) Filed: Apr. 21, 2008

(65) Prior Publication Data
US 2009/0035099 A1    Feb. 5, 2009

(30) Foreign Application Priority Data
Jul. 31, 2007  (JP) .............................. 2007-198618

(51) Int. Cl.
*B65G 1/12* (2006.01)
(52) U.S. Cl. .................. 414/217; 414/411; 414/935; 141/51
(58) Field of Classification Search .............. 414/217, 414/217.1, 410, 411, 935, 941; 141/47, 63, 141/51
See application file for complete search history.

(56) References Cited

U.S. PATENT DOCUMENTS

| | | | |
|---|---|---|---|
| 6,817,822 B2 * | 11/2004 | Tokunaga | 414/217 |
| 6,867,153 B2 | 3/2005 | Tokunaga | |
| 7,523,769 B2 * | 4/2009 | Miyajima et al. | 141/47 |
| 2004/0237244 A1 * | 12/2004 | Suzuki et al. | 15/301 |
| 2005/0095098 A1 * | 5/2005 | Miyajima et al. | 414/411 |
| 2006/0088406 A1 * | 4/2006 | Miyajima et al. | 414/805 |
| 2007/0151619 A1 | 7/2007 | Okabe | |
| 2007/0151620 A1 | 7/2007 | Okabe | |
| 2008/0134483 A1 | 6/2008 | Aburatani | |
| 2009/0169342 A1 * | 7/2009 | Yoshimura et al. | 414/217 |

FOREIGN PATENT DOCUMENTS

| | | |
|---|---|---|
| EP | 1 780 785 A1 | 5/2007 |
| JP | 11-145245 | 5/1999 |
| JP | 2003-7799 | 1/2003 |
| JP | 2003-45933 | 2/2003 |

(Continued)

OTHER PUBLICATIONS

U.S. Appl. No. 12/624,579, filed Nov. 24, 2009, Okabe, et al.

*Primary Examiner*—Charles A Fox
(74) *Attorney, Agent, or Firm*—Oblon, Spivak, McClelland, Maier & Neustadt, L.L.P.

(57) ABSTRACT

Adjacent to an opening portion 10 in an FIMS system is provided an enclosure that encloses the operation space of a door and has a second opening portion 31 opposed to the opening portion 10. A curtain nozzle is provided above the upper edge of the opening portion 10 in the upper portion in the enclosure. A purge gas is supplied from the curtain nozzle along a direction from the upper edge to the lower edge of the opening portion. In addition, a gas outlet through which the purge gas flows from the interior of the enclosure out into the exterior is provided on the wall of the enclosure to which the purge gas flowing in the above described direction is directed, whereby an increase in the partial pressure of oxidizing gases in the interior of the FOUP is prevented.

12 Claims, 10 Drawing Sheets

FOREIGN PATENT DOCUMENTS

| | | |
|---|---|---|
| JP | 2004-119627 | 4/2004 |
| JP | 2004-235516 | 8/2004 |
| JP | 2007-180517 | 7/2007 |
| JP | 2008-160076 | 7/2008 |
| WO | WO 2005/124853 A1 | 12/2005 |

\* cited by examiner

LID OPENING/CLOSING SYSTEM FOR CLOSED CONTAINER AND SUBSTRATE PROCESSING METHOD USING SAME

BACKGROUND OF THE INVENTION

1. Field of the Invention

The present invention relates to what is called a FIMS (Front-opening Interface Mechanical Standard) system that is used in a semiconductor manufacturing process or the like to transfer wafers stored in the interior of a transfer container called a pod from one semiconductor processing apparatus to another. More specifically, the present invention relates to a FIMS system or a lid opening and closing system in which a closed container for storing wafers in the form of a pod called FOUP (Front-Opening Unified Pod) is placed thereon, the lid of the pod is opened and closed to bring wafers into it, and a purge mechanism that cleans the interior of the pod is provided.

2. Related Background Art

In the past, the semiconductor manufacturing process had been performed in what is called a clean room that is constructed by establishing a high degree of cleanliness in the room in which semiconductor wafers are handled. In recent years, however, in view of an increase in the wafer size and with a view to reduce cost incurred in maintenance of the clean room, use has been made of a method of keeping clean only the interior of a processing apparatus, a pod (or wafer container) and a mini-environment through which substrates or wafers are transferred between the pod and the processing apparatus.

The pod is composed of a substantially cubical body having shelves provided therein that can hold a plurality of wafers in a parallel and separated state and an opening provided on one side thereof through which wafers can be brought into/out of it, and a lid for closing the opening. Those pods which have an opening portion provided not on the bottom but on one lateral side thereof (i.e. the front side to be opposed to the mini-environment) are collectively called FOUP (Front-Opening Unified Pod). The present invention mainly pertains to technologies in which the FOUP is used.

A structure that defines the above mentioned mini-environment has a first opening portion to be opposed to the opening of the pod, a door that closes the first opening portion, a processing apparatus side opening portion provided on the semiconductor processing apparatus side of the unit, and a transferring robot that is adapted to reach into the interior of the pod through the first opening portion to pick up a wafer and transfer the wafer into the processing apparatus through the processing apparatus side opening portion. The structure that defines the mini-environment also has a support table that supports the pod in such a way that the pod opening is placed just in front of the door.

On the top surface of the support table are provided positioning pins to be fitted into positioning holes provided on the bottom surface of the pod to regulate the placement position of the pod and a clamp unit for engaging with a clamped portion provided on the bottom surface of the pod to fix the pod to the support table. Typically, the support table is adapted to be movable toward and away from the door over a predetermined distance. When the wafers in a pod are to be transferred into the processing apparatus, the pod placed on the support table is moved until the lid of the pod abuts the door, and then after abutment, the lid is removed by the door. By this process, the interior of the pod and the interior of the processing apparatus are bought into communication with each other through the mini-environment to allow wafer transferring operations that will be performed repeatedly. All of the support table, the door, the first opening portion, a mechanism for opening and closing the door and a wall partly defining the mini-environment and having the first opening are included in the FIMS (Front-opening Interface Mechanical Standard) system.

Normally, the interior of the pod in which wafers or the like are stored is filled with dry nitrogen gas that is maintained highly clean to prevent contaminative materials and oxidizing gas etc. from entering the interior of the pod. However, when the wafers in the pod are brought into a processing apparatus to perform a specific processing thereon, the interior of the pod and the interior of the processing apparatus are continuously kept in communication with each other. A fan and a filter are provided in the upper portion of the chamber in which the transfer robot is disposed, so that particle-controlled clean air is normally introduced into the chamber. However, if such air enters the interior of the pod, there is a possibility that the surface of the wafers is oxidized by oxygen or moisture contained in the air.

In association with miniaturization and higher performance of semiconductor elements, oxidization caused by oxygen etc. entering the interior of the pod is recently being paid attention to, though it was not a serious problem before. Such oxidizing gases may generate ultra-thin oxide film on the surface of a wafer or on various layers formed on a wafer. Due to the presence of such an oxide film, there is a possibility that desired characteristics of miniaturized elements are not ensured. A countermeasure to this is to prevent gases in which the oxygen partial pressure is not controlled from entering the interior of the pod from the exterior of it. As a specific method, Japanese Patent Application Laid-Open No. 11-145245 teaches to provide a gas supply nozzle and a suction nozzle in the region adjacent to the opening of the pod in a FIMS system to form an air curtain that substantially closes the pod opening. The air curtain thus formed prevents external gases from entering the interior of the pod.

In the interior of semiconductor manufacturing apparatuses, a gas with which various wiring etc. formed on a wafer can be contaminated is sometimes used in a process such as etching in the interior of the processing apparatus. Japanese Patent Application Laid-Open No. 2003-007799 discloses a method for preventing such contaminant gases from entering the interior of the pod from the interior of the processing apparatus in such cases. In this method also, a fan is used to form an air curtain in front of the opening of the pod in a FIMS system so as to prevent gases from flowing into the interior of the pod from the processing apparatus. This method is considered to be effective in preventing oxygen from flowing into the interior of the pod.

However, when these methods were implemented practically, it was found that the oxygen partial pressure in the interior of the pod significantly increased in fact just after the pod opening is opened. In view of this, these methods need to be further improved to meet the aforementioned demand. Given the above described situation, the inventor of the present invention previously developed a system in which entrance of oxidizing gases into the interior of the pod is prevented by changing the shape of the gas supply nozzle used in forming the air curtain in various ways and reducing the oxygen concentration in the gas that forms the air curtain also at positions distant form the nozzle. Furthermore, the inventor previously developed a system in which a purge gas is introduced into the interior of the pod in addition to forming an air curtain to further reduce oxidizing gases in the interior of the pod. However, to meet various demands such as higher performance of semiconductor devices or increases in the processing performance of semiconductor manufacturing apparatuses, a further reduction in the partial pressure of oxidizing gases in the pod mounted on the FIMS system is desired.

SUMMARY OF THE INVENTION

The present invention has been made in view of the above described situations and has as an object to provide a lid opening and closing system for a pod as a closed container in which the partial pressure of oxidizing gases such as oxygen in the interior of a pod can be kept to a predetermined low level even after the pod has been opened.

To achieve the above object, according to the invention, there is provided a lid opening and closing system that detaches a lid of a storage container having a substantially box-like body having an opening on one side thereof that can store an object to be stored in the interior thereof and the lid that can be detached from the body and closes the opening to form a closed space in cooperation with the body, to open the opening thereby enabling to bring the object to be stored into/out of the storage container, comprising a support table on which the storage container is to be placed, a mini-environment disposed adjacent to the support table in which a mechanism for transferring the object to be stored under particle control is housed, a first opening portion having a substantially rectangular shape formed on a wall adjacent to the support table that defines a part of the mini-environment, the first opening portion being provided at a position at which it can be just opposed to the opening of the storage container that is placed on the support table, a door that can hold the lid and substantially close the first opening portion, the door bringing the opening and the first opening portion into communication by opening the first opening portion while holding the lid, an enclosure provided in the mini-environment continuously with the first opening portion to enclose a space in which the door moves and define a second mini-environment, the enclosure having a second opening portion that allows communication between the first opening portion and the mini-environment and through which the mechanism for transferring the object to be stored can pass together with the object to be stored, and a curtain nozzle disposed above the upper edge of the first opening portion in the enclosure, the curtain nozzle being able to supply a specific gas along a direction from the upper edge to the lower edge of the first opening portion, wherein the enclosure has a gas outlet through which the gas can flow out into the mini-environment along the direction of the gas flow.

In the above described lid opening and closing system, purges nozzle that can supply a gas in a direction toward the interior of the storage container may further be provided outside side edges of the first opening portion in the second mini-environment. In the case where such a purge nozzle is provided, it is preferred that the direction of gas supply by the purge nozzle be substantially parallel to a plane that extends perpendicularly to the direction of gas supply from the curtain nozzle and toward a certain point equidistant from the purge nozzles in the plane. Furthermore, in the above described lid opening and closing mechanism, the door may substantially close the second opening portion by its flat surface opposite to the surface that closes the first opening portion. In this case, the flat surface or a member embedded in the flat surface may be adapted to come in contact with a portion of the enclosure defining the second opening portion around it to enhance the degree of closure of the second mini-environment. The above described lid opening and closing system may be designed in such a way that the door is swung from a position at which it closes the first opening portion upon substantially closing the second opening portion, and the gas supplied from the curtain nozzle can be introduced into the storage container in the state in which the second opening portion is closed by the door.

To achieve the above described object, according to another aspect of the present invention, there is provided a method of processing an object to be stored in which a lid of a storage container having a substantially box-like body having an opening on one side thereof that can store an object to be stored in the interior thereof and the lid that can be detached from the body and closes the opening to form a closed space in cooperation with the body is detached from the storage container to open the opening thereby enabling to bring the object to be stored into/out of the storage container, the object to be stored is brought into/out of the storage container, and a predetermined processing is performed on the object to be stored in the exterior of the storage container, comprising the step of opposing the opening of the storage container to a first opening portion having a substantially rectangular shape provided on a wall that defines a particle-controlled mini-environment, the step of holding the lid by a door that substantially closes the first opening portion, the step of driving the door holding the lid to open the first opening portion, and the step of bringing the object to be stored into/out of the storage container through the opening and the first opening portion, wherein the object to be stored is brought into/out of the storage container through a second mini-environment that is continuous with the first opening portion and has a second opening portion in communication with the mini-environment, there is a certain gas flow that flows from the upper edge to the lower edge of the first opening portion, and the gas flow flows out into the mini-environment through a gas outlet provided at a position to which the gas flow in the mini-environment is directed. In the above described method of processing an object, a purge gas may be supplied to the interior of the storage container since the time at which the lid is detached from the storage container. In this case, it is preferred that the direction in which the purge gas is supplied be parallel to a plane that extends perpendicularly to the direction in which the gas supplied along the direction from the upper edge to the lower edge of the first opening portion and toward a certain point equidistant from purge nozzles in the plane. Furthermore, in the above described method of processing an object, when the door holding the lid has detached the lid from the storage container, the surface of the lid that faces the interior of the storage container temporarily may be adapted to deflect the direction of the gas supplied along the direction from the upper edge to the lower edge of the first opening portion to introduce the gas into the interior of the storage container. It is more preferable that a state in which the gas is introduced into the interior of the storage container be achieve at a time other than during the period in which each object to be stored is brought into/out of the storage container. In the above described method of processing an object, it is more preferred that when the gas is introduced into the interior of the storage container, the second opening portion be closed by a flat surface of the door opposite to the surface that holds the lid.

According to the present invention, between a the interior space of the pod and a mini-environment in which particle control is performed but the partial pressure of oxidizing gases is not performed, a second mini-environment in which not only particle control but also control of the oxidizing gas partial pressure is performed is provided. This enables to reduce the amount of the oxidizing gases diffusing from the mini-environment to the pod can be greatly reduced as compared to that in the conventional apparatuses. In addition, according to the present invention, the second mini-environment and the mini-environment are in communication with each other by a gas outlet so that gases in the second mini-environment flow into the mini-environment in accordance with pressure difference between these spaces. By this feature, it is easily possible to create pressure differences among the second mini-environment, the mini-environment and the atmosphere outside the mini-environment by a simple structure. This enables to effectively prevent diffusion of gases from the mini-environment to the pod.

In the second mini-environment, a downward flow of a purge gas is created so that what is called a gas curtain is formed by the downward gas flow. This enables to effectively prevent scattering of particles and diffusion of atmospheric air from the mini-environment toward the pod. Furthermore, by making use of these effects in combination, it is possible to achieve, by using a very small amount of purge gas, the effect of keeping the oxidizing gas partial pressure as low as or lower than that in conventional systems in which a purge gas is simply introduced into the interior of the pod to prevent entrance of oxidizing gases into the pod (which system needs a large amount of purge gas) and conventional systems in which a large amount of purge gas is supplied from one portion and exhausted by suction at another portion to thereby form a gas curtain.

It is well known that when a gas is ejected from a nozzle, other gases existing in the neighborhood of the nozzle opening is sucked into the ejected gas, so that flow of mixed gas is formed. For this reason, when the gas curtain is created, there is a possibility that gases existing in the neighborhood of the nozzle is sucked into the purge gas. This may lead to a decrease in the concentration of the purge gas such as an inert gas that constitutes the gas curtain and the risk of introduction of oxidizing gases into the interior of the pod from the gas curtain. According to the present invention, after the second mini-environment that is relatively small in volume and substantially closed by the enclosure and the door has been filled with the purge gas to some extent, the purge gas is further supplied from a purge nozzle different from the curtain nozzle. So even if the gases existing in the neighborhood of the nozzle is sucked into the purge gas supplied from the purge nozzle, the oxidizing gas partial pressure in the gases thus sucked in is essentially low. Thus, a decrease in the purity of the purge gas can be prevented.

Furthermore, according to the present invention, the curtain nozzle is also enclosed in the enclosure, and it is easily possible to fill the environment of the curtain nozzle with the purge gas having a certain high level of purity. This also is the case with the purge nozzle. Since the purge nozzle is also enclosed in the enclosure, it is easily possible to fill the environment of the purge nozzle with the purge gas having a certain high level of purity. Thus, the partial pressure of oxidizing gases in the gas introduced to the environment of the pod can be kept advantageously low as compared to conventional apparatuses.

DESCRIPTION OF THE PREFERRED EMBODIMENT

Figure 1:
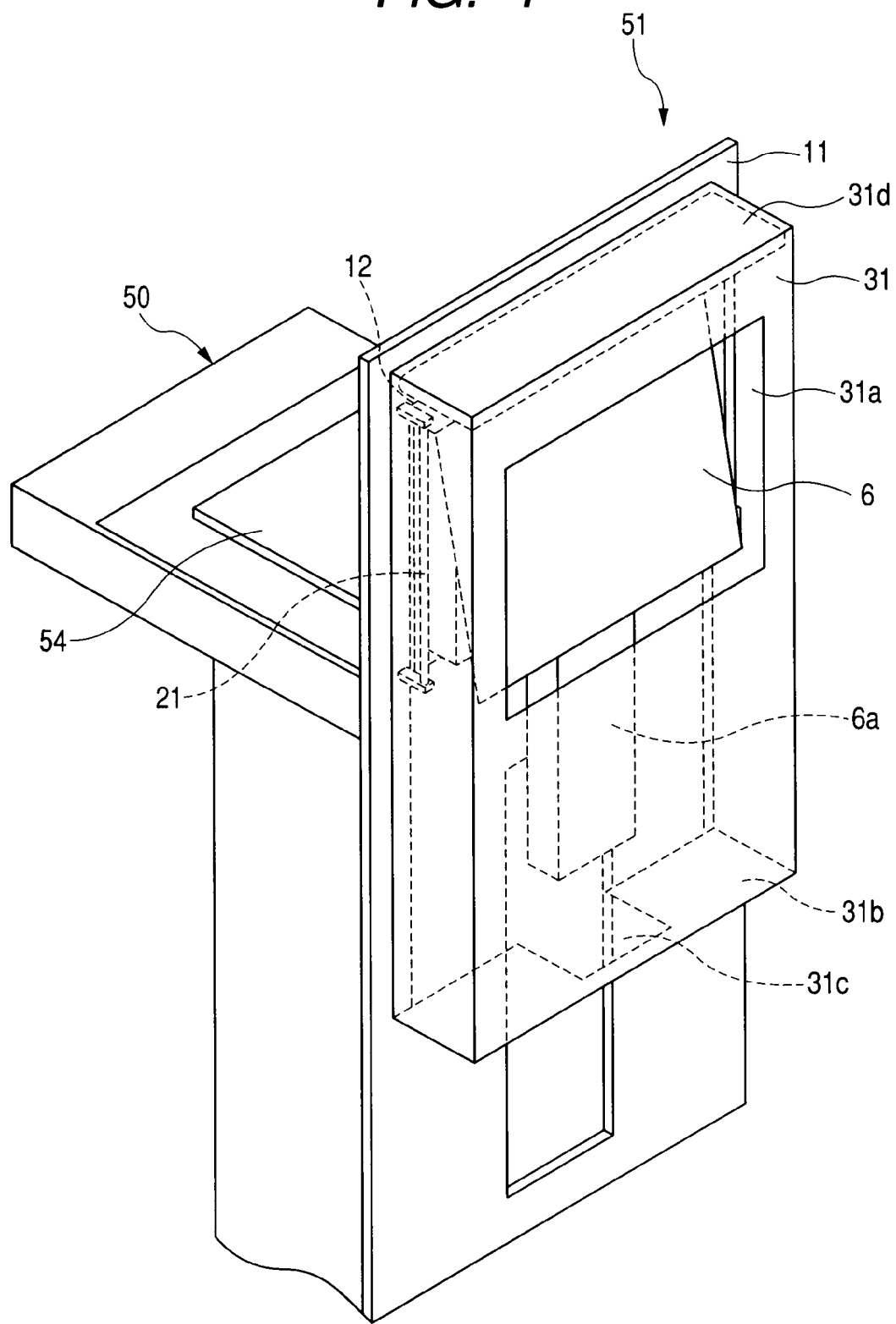
FIG. 1 is a perspective view schematically showing the relevant portions of a lid opening and closing system according to an embodiment of the present invention.
Figure 2A:
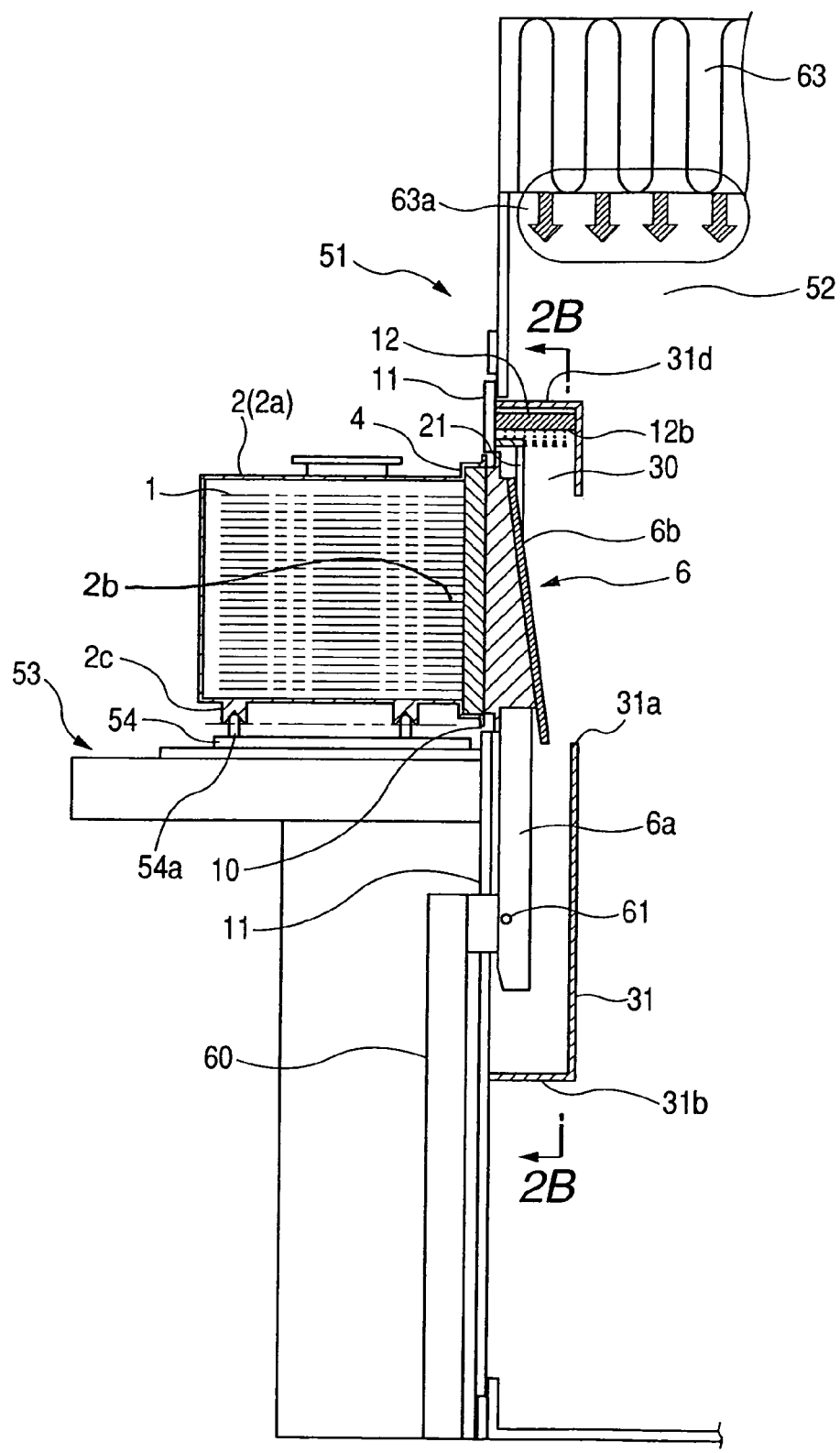
FIG. 2A schematically shows the lid opening and closing system according to the first embodiment of the present invention shown in FIG. 1 including a load port, a pod, a lid of the pod and a part of an opener, in cross section taken on a plane perpendicular to the opening of the pod.
Figure 2B:
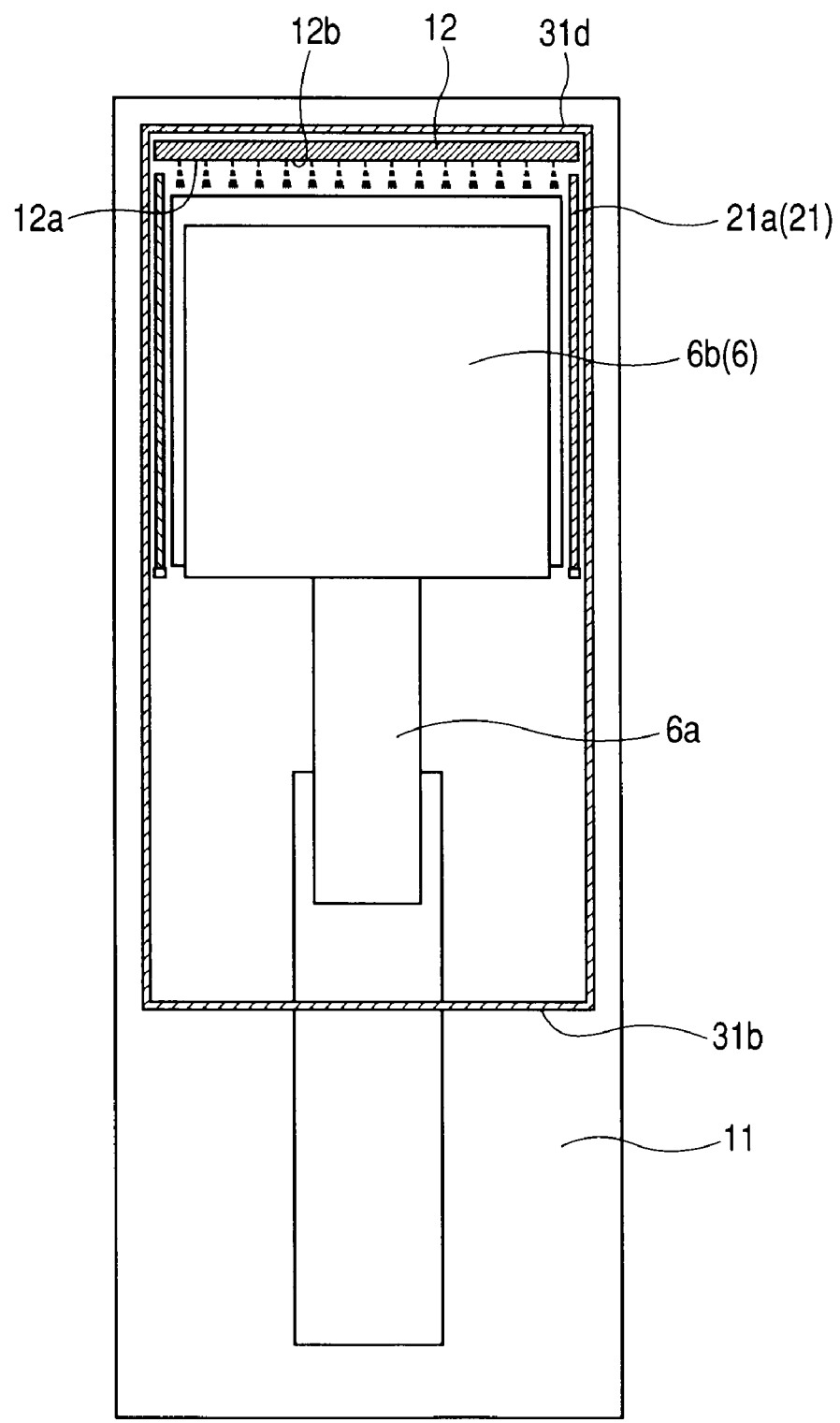
FIG. 2B is a cross sectional view taken along line 2B-2B in FIG. 2A as seen from the mini-environment.

In the following, an embodiment of the present invention will be described with reference to the accompanying drawings. FIG. 1 is a schematic perspective view seen from the mini-environment side. FIG. 1 shows the general structure of the relevant portions of a lid opening and closing apparatus (FIMS, which will be hereinafter referred to as a load port) according to an embodiment of the present invention. In FIG. 1, only the aforementioned support table, a door, a first opening portion, a part of a door opening and closing mechanism, a wall on which the first opening portion is provided and that partly defines a mini-environment and a novel enclosure that is provided according to the present invention and structures associated to them are shown. FIG. 2A is schematic cross sectional view of the load port and the pod in the state in which the pod is placed on the load port (or the support table) and the lid of the pod is in contact with the door. FIG. 2B is a cross sectional view taken along line 2B-2B in FIG. 2A as seen from the mini-environment. The support table etc. have various additional equipments, but detailed illustrations and descriptions thereof will not be made in this specification, since they are not directly relevant to the present invention.

First, the pod to be mounted on the load port and the wafer stored in the pod will be described (see FIG. 2A). The body 2a of the pod 2 has an interior space in which objects to be processed or wafers 1 are to be stored. The body 2a has a substantially box like shape and has an opening on one lateral side thereof. The pod 2 also has a lid 4 for closing the opening 2b of the body 2a. In the interior of the body 2a is provided a rack (not shown) having a plurality of shelves on which wafers 1 are arranged one above another along the vertical direction while being held in a horizontal orientation. The wafers 1 placed thereon are stored in the pod 2 at regular intervals between them. The wafer 1 corresponds to the object to be stored in the present invention, the pod 2 corresponds to the storage container in the present invention, the body 2a has a basically box-like shape and corresponds to the body that is defined to have a substantially box-like shape in the present invention, and the opening 2b of the pod 2 that has a basically rectangular shape corresponds to the opening that is defined to have a substantially rectangular shape in the present invention.

The load port 51 according to the present invention includes a support table 53, a door 6, a first opening portion 10 that function as an opening portion of the load port, a door opening and closing mechanism 60, a wall 11 or a member on which the first opening portion is provided and that partly defines a mini-environment (or a transfer chamber 52 that will be described later) and a novel enclosure 31 that is provided according to the present invention. The support table 53 includes a movable plate 54 having a flat surface on its top on which the pod 2 is actually placed and that can move the pod placed thereon toward and away from the first opening portion 10. Positioning pins 54a are provided on the flat surface of the movable plate 54. The positioning pins 54a are adapted to be fitted to positioning recesses 2c provided on the bottom surface of the pod body 2a, whereby the positional relationship between the pod 2 and the movable plate 54 is uniquely determined.

The first opening portion 10 provided on the wall 11 is rectangular in shape and has a size that allows to receive the lid 4 that closes the pod opening 2b when the pod 2 positioned on the movable plate 54 is set at the position closest to the first opening portion 10 by the movable plate 54. In other words, the size of the rectangular first opening portion 10 is a little larger than the rectangular outer contour of the lid 4. The movable plate 54 may set the pod 2 at a position at which the lid 4 of the pod 2 can be removed from the pod body 2a by the door 6. The door 6 is supported by the door opening and closing mechanism 60 by means of the door arm 6a. The door opening and closing mechanism 60 can move the door 6 between a position at which the door 6 substantially closes the first opening portion 10 and a retracted position at which it leaves the first opening portion 10 fully open to allow transfer of wafers 1 into/out of the interior of the pod 2 through the first opening portion 10 by a transfer mechanism that is not shown in the drawings.

The door opening and closing mechanism 60 includes a plurality of air cylinders (not shown) and causes the door arm 6a and the door 6 to swing about pivot 61. By this swinging operation, the door 6 is swung between the position at which it closes the first opening portion 10 and the position at which it assumes a retracted posture, in which it is moved to the retracted position vertically below. The surface 6b of the door 6 that is opposite to the surface to be faced to the first opening portion 10 is designed to be a rectangular flat surface having a size that enables to close a second opening portion 31a that will be described later. This flat surface 6b is arranged to be inclined relative to the surface of the door 6 to close the first opening portion 10. The angle of this inclination is designed in such a way that the flat surface 6b becomes parallel to the surface on which the second opening portion 31a is provided when the door 6 has been swung into the retracted posture to open the first opening portion 10.

The enclosure 31 has a rectangular parallelepiped shape, and its side facing the wall 11 is open. The horizontal dimension of the space inside the enclosure 31 (i.e. the dimension along the direction of the horizontal edge of the first opening portion 10, or the width) is designed in such a way that the door 6 and a curtain nozzle that will be described later can be accommodated in that space. The vertical dimension of the space (i.e. the dimension along the direction of the vertical edge of the first opening portion 10) is designed in such a way that the door 6 can be accommodated in that space when it is in the retracted position and when it is in the position at which it closes the first opening portion 10 and that a later-described purge nozzle 21 provided above the upper edge of the first opening portion 10 is also accommodated in the enclosure 31.

The dimension of the space in the depth direction (i.e. the dimension in the moving direction of the movable plate 54) is designed in such a way that when the door 6 is stopped in the retracted posture after swinging about the pivot 61 to open the first opening portion 10, the enclosure 31 and the flat surface 6b of the door 6 that is opposite to the surface facing the first opening portion 10 do not interfere with each other and that the flat surface 6b can substantially close the second opening portion 31a. The enclosure 31 is arranged at an optimum position at which it accommodates the purge nozzle 21, the curtain nozzle 12 and the door 6 and defines, in cooperation with the wall 11, a second mini-environment 30 having a substantially rectangular parallelepipedal shape.

On the wall of the enclosure 31 that is opposed to the first opening portion 10 is provided a second opening portion 31a having a rectangular shape. The second opening portion 31 is opposed to the first opening portion 10. It is preferred that the size of the rectangular second opening portion 31a be designed to be as small as possible, so long as the enclosure 31 does not interfere with the operation of transferring wafers 1 into/out of the pod 2 by a transferring mechanism (not shown) provided in the mini-environment. By this feature, the second mini-environment 30 in the enclosure 31 is closed as much as possible so that the space 30 and the mini-environment 52 are substantially isolated from each other. The bottom wall 31b of the enclosure 31 toward which the door 6 is retracted has an opening 31c through which the door arm 6a can pass. What is called a punched metal plate that has a number of through holes is used to constitute the bottom wall 31b. Into the interior of enclosure 31 is supplied a purge gas vertically downwardly from a curtain nozzle 21 that will be described later. By using a punched metal plate as the bottom wall 31b, ceaseless downward air flow is allowed to be created.

The curtain nozzle 12 is disposed at a position just in front of the wall 11 and above the first opening portion 10 (i.e. above the upper edge of the first opening) in the top portion of the interior space of the enclosure 31. The curtain nozzle 12 is provided in order to create downward air flow in the second mini-environment 30 and to create a gas curtain just in front of the first opening portion 10. In this embodiment, the curtain nozzle 12 is disposed as close to the top wall 31d (or the wall opposite to the above mentioned bottom wall 31b) of the enclosure 31. The curtain nozzle 12 has a rectangular parallelepipedal shape, and its upper and lower surfaces are a little smaller than the aforementioned top wall 31d. On the lower surface 12a thereof are plurality of nozzle openings 12b.

In the interior of the enclosure 31 are provided purge nozzles 21 to supply a purge gas for purging the interior of the pod 2. Each purge nozzle 21 has a tubular purge nozzle body 21a extending in one direction, which is connected to a purge gas supply system (not shown). The purge nozzle body 21a is disposed on the side of the load port opening portion 10 that is opposite to the support table on which the pod 2 is to be placed. There are two such purge nozzle bodies 21a in a pair that are disposed laterally outside the area of the opening portion 10 in such a way as to be adjacent thereto and extending parallel to the side edges of the opening portion 10.

Figure 3:
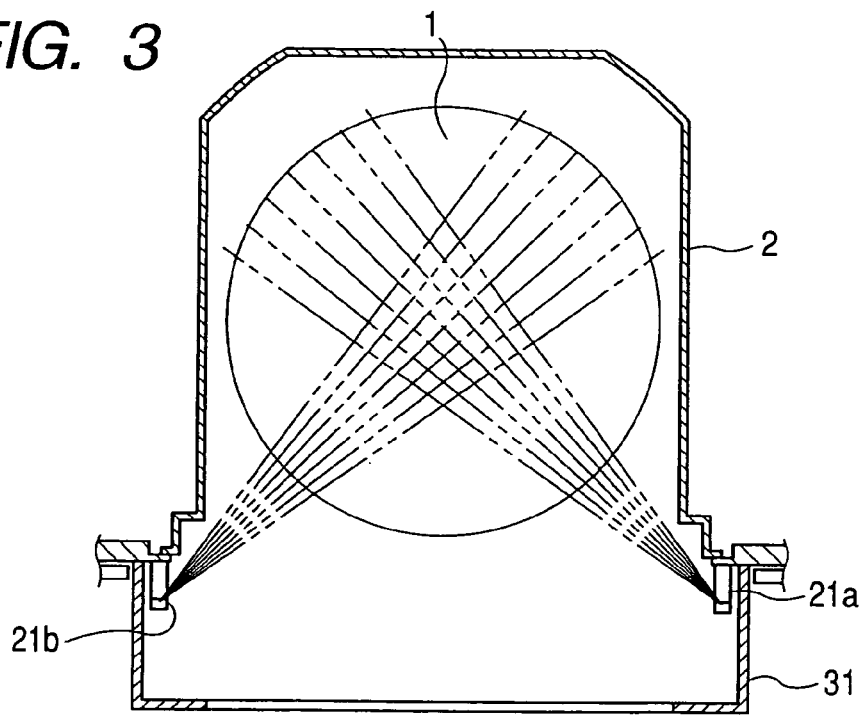
FIG. 3 illustrates the direction in which purge gas supplied from the purge nozzle toward the interior of the pod.

FIG. 3 schematically shows the structure of the purge nozzle bodies 21a, the pod 2, the wafer 1 and the enclosure 31 as seen from above. It is preferred that each of the purge nozzle bodies 21a be provided with a plurality of purge nozzle opening portions 21b arranged at regular intervals the same as the intervals of the wafers 1 stored in the pod 2 along the direction in which the purge nozzle bodies extend, at positions aligned with the spaces between the wafers 1. The purge nozzle opening portions 21b are oriented to the central portion of the wafers 1. It is preferred that the direction of gas supply from the purge nozzles be parallel to the plane perpendicular to the direction of gas supply from the curtain nozzle and oriented to a certain point equidistant from the two purge nozzles in that plane.

By arranging the direction of purge gas supply perpendicular to the direction of flow of the curtain gas, the purge gas can be supplied into the pod 2 with reliability. Although it is most effective, in principle, to eject the purge gas toward the wafer surface, the gas is supplied in a direction parallel to the wafer surface, since the space between the wafers 1 in the pod 2 is not large. In practice, the purge nozzles 21 and the curtain nozzle 12 mentioned above are connected to a gas supply system, which is not illustrated in the drawings to facilitate understanding of the structure of this embodiment. Since the gas supply system may be a general gas supply system that includes a gas source and a regulator etc, a description thereof will be omitted.

In the apparatus of this embodiment, the nozzle openings 12b are provided substantially all over the lower surface 12a of the curtain nozzle 12. Thus, when the door 6 is at its retracted position, ceaseless downward flow of the curtain gas supplied from the curtain nozzle 12 is created in the space between the first opening portion 10 and the second opening portion 31a in the enclosure 31. When the second mini-environment 30 is in communication with the interior of space of the pod 2, it is also in communication with the mini-environment 52 via the second opening portion 31a and the through holes on the bottom wall 31b of the enclosure 31. Thus, the holes on the punched metal plate serve as gas outlets to provide flow paths of the curtain gas. According to the present invention, the gas outlets are arranged at positions opposed to the flow direction of the curtain gas and the openings thereof are located perpendicular to the gas flow. By arranging the flow paths of the curtain gas on the bottom wall 31b of the enclosure 31, it is possible to cause the downward gas flow to reach the lower portion of the mini-environment 30 in a stable flow state with reliability.

Contamination of the curtain gas with particles or the like can be more easily controlled than contamination of air (i.e. atmospheric air) introduced into the mini-environment 52 through a fan filter unit that will be described later. In this embodiment, accordingly, by providing downward flow of the curtain gas just in front of the first opening portion 10, entrance of contaminants into the interior of the pod 2 from the mini-environment 52 can be prevented more effectively than in conventional load ports. In addition, by providing the bottom wall 31b made of a punched metal plate to restrict the open portion rather than leaving the bottom fully open, the second mini-environment 30 can be nearly closed, whereby the flow rate of the curtain gas needed can be advantageously reduced and entrance of particles or the like that move upwardly into the second mini-environment 30 from the bottom 31b side can be advantageously prevented.

To maintain a high degree of cleanness in the mini-environment 52, downward flow 63a of clean air is created by a fan filter unit (FFU) 63 provided in the upper portion in that space. In other words, particles in the mini-environment 52 is controlled, and the mini-environment 52 is used as the space in which the transfer mechanism is disposed. In the lower portion of the mini-environment 52 is a gas flow path that is not shown in the drawings, and the pressure in the mini-environment 52 is maintained to be slightly higher than the pressure in the exterior space outside the mini-environment by adjusting the air flow created by the fan filter unit 63. By adjusting the quantity of the curtain gas flowing out through the gas flow path that is in communication with the mini-environment 52 and the quantities of the curtain gas and the purge gas respectively supplied by the curtain nozzle 12 and the purge nozzle 21, it is possible to create the environment in which the pressures in the second mini-environment 30 is made higher than the pressure in the mini-environment 52 and the pressure in the mini-environment 52 is made higher than the exterior space.

In practice, the pressure difference between these spaces is small. For example, in the case where the second mini-environment 30 is provided with a specific exhaust path through which gas is exhausted, it is practically difficult to create such a pressure difference. According to the present invention, a communication portion is provided at a downstream position in the straight flow of the purge gas, whereby the flow passage that is in communication with the mini-environment 52 at the bottom of the second mini-environment 30 serves as the main gas flow passage as the gas outlet from the second mini-environment 30. By appropriately designing the exhaust resistance of that passage, the above mentioned pressure difference can be easily created.

In this embodiment, the opening in the second opening portion 31a extends parallel to the direction of downward air flow 63a from the fan filter unit 63. Furthermore, the direction of the purge gas flow supplied by the curtain nozzles 12 is also parallel the opening in the second opening portion 31a. The flow of the purge gas and the downward air flow 63a are parallel, and a slight difference in flow velocity is maintained between them with a view to maintain a small pressure difference. Accordingly, the venturi effect does not work significantly. So the quantity of air drawn into the second mini-environment 30 from the mini-environment 52 by the venturi effect is little. On the other hand, the air in the interior of the pod 2 is not flowing basically, and the difference in the flow velocity between that air flow and the curtain gas flow is large accordingly. Therefore, the air in the interior of the pod 2 can be effectively drawn into the second mini-environment 30 by the venturi effect. With this effect and the supply of the purge gas, the interior of the pod 2 can be more effectively purged.

For example, in a case where already-processed wafers are stored in the pod and the already-processed wafers, when transferring of the wafers into/out of the pod is performed, a substance(s) of a gas(es) used in the processing adhering on the wafer surface may be desorbed therefrom to cause contamination of the mini-environment 52. According to the present invention, the desorbed gas is removed from the vicinity of the wafer surface by the purge gas and bought from the second mini-environment 30 to the mini-environment 52 through the aforementioned gas outlets by the curtain gas. The desorbed gas can be further brought to the exterior of the mini-environment 52 through the exhaust portion (not shown) provided in the lower portion of the mini-environment 52 or on the bottom wall of the mini-environment 52 to exhaust the downward gas flow 63a from the mini-environment 52 to the exterior space. Thus, the gas generated from the wafers is exhausted to the exterior space through the second mini-environment that is relatively small and in which the velocity of the downward flow is high rather than though the mini-environment in conventional apparatuses which is relatively large and in which the velocity of the downward flow is low, with minimum time taken in providing the mini-environment. In other words, by providing the curtain gas and the purge gas that flow in the different directions simultaneously, the interior of the pod 2 in which already-processed wafers are stored can be purged more effectively.

In the case where a gas is supplied into a specific space by a nozzle or the like, the ambient gas in the neighborhood of the nozzle is sucked in by the venturi effect, and consequently the purity of the supplied gas is decreased from the beginning of ejection from the nozzle or the like. According to the present invention, in the back of the curtain nozzle 12 and the purge nozzles 21 is the wall of the enclosure 31, and there is not a possibility that the atmospheric air is supplied to the region near these nozzles from the exterior of the enclosure. Thus, gases other than the predetermined gas can be removed from the neighborhood of the nozzles as much as possible by ejecting the gas for some time. Consequently, gases having a high purity can be supplied from an area where the nozzles are provided.

Next, the operation of the apparatus upon transferring wafers 1 into/out of the pod 2 will be described. When the pod 2 is placed on the support table 53, the first opening portion 10 is substantially closed by the door 6. In this embodiment, the door 6 has such a size that leaves a clearance around the door 6 to allow communication between the mini-environment 52 and the exterior space when the door 6 is at the position at which it closes the first opening portion 10. Thus, the door 6 can close the first opening portion 10 only nearly, in this embodiment. After the pod 2 has been placed, the movable plate 54 moves toward the first opening portion 10 and stops at the position at which the lid 4 of the pod 2 is in contact with the door 6. Then, the door 6 catches or holds the lid 4 by an engagement mechanism that is not shown in the drawings. It should be noted that supply of the downward gas flow in the mini-environment 52 by the fan filter unit 63 and supply of the downward gas flow in the second mini-environment 30 by the curtain nozzle 12 has been ceaselessly performed before the pod 2 is placed.

As described before, the flat portion 6b on the rear side of the door 6 is inclined relative to the gas flow of the gas curtain so that it become closer to the second opening portion 31a as it extends away from the curtain nozzle 12. The lower end of the flat portion 6b is designed to be located below the lower edge of the second opening portion 31a. The pressure in the second mini-environment 30 defined by the enclosure 31 is made higher than the pressure in the mini-environment 52 by the gas supply from the curtain nozzle 12. Thanks to this pressure difference and the feature that the flow direction of the gas curtain is deflected by the inclined surface of the flat portion 6b so that a part of the gas flow is introduced into the mini-environment 52, entrance of particles or the like from the mini-environment 52 into the second mini-environment 30 can be effectively prevented.

Figure 4A:
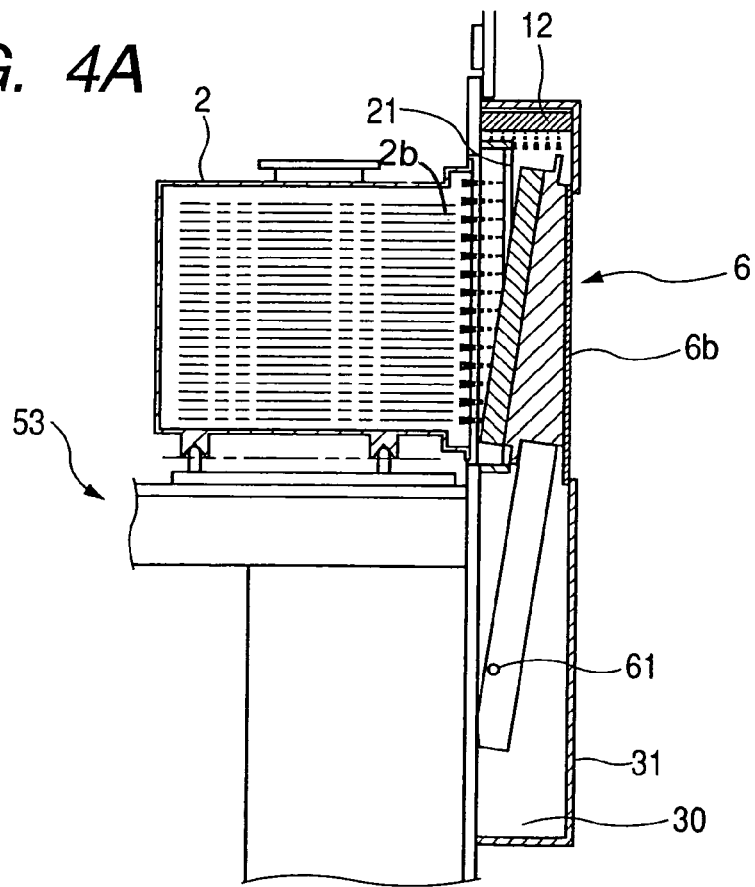
FIG. 4A shows a certain stage of the operation of opening or closing the lid by the lid opening and closing system shown in FIG. 1.
Figure 4B:
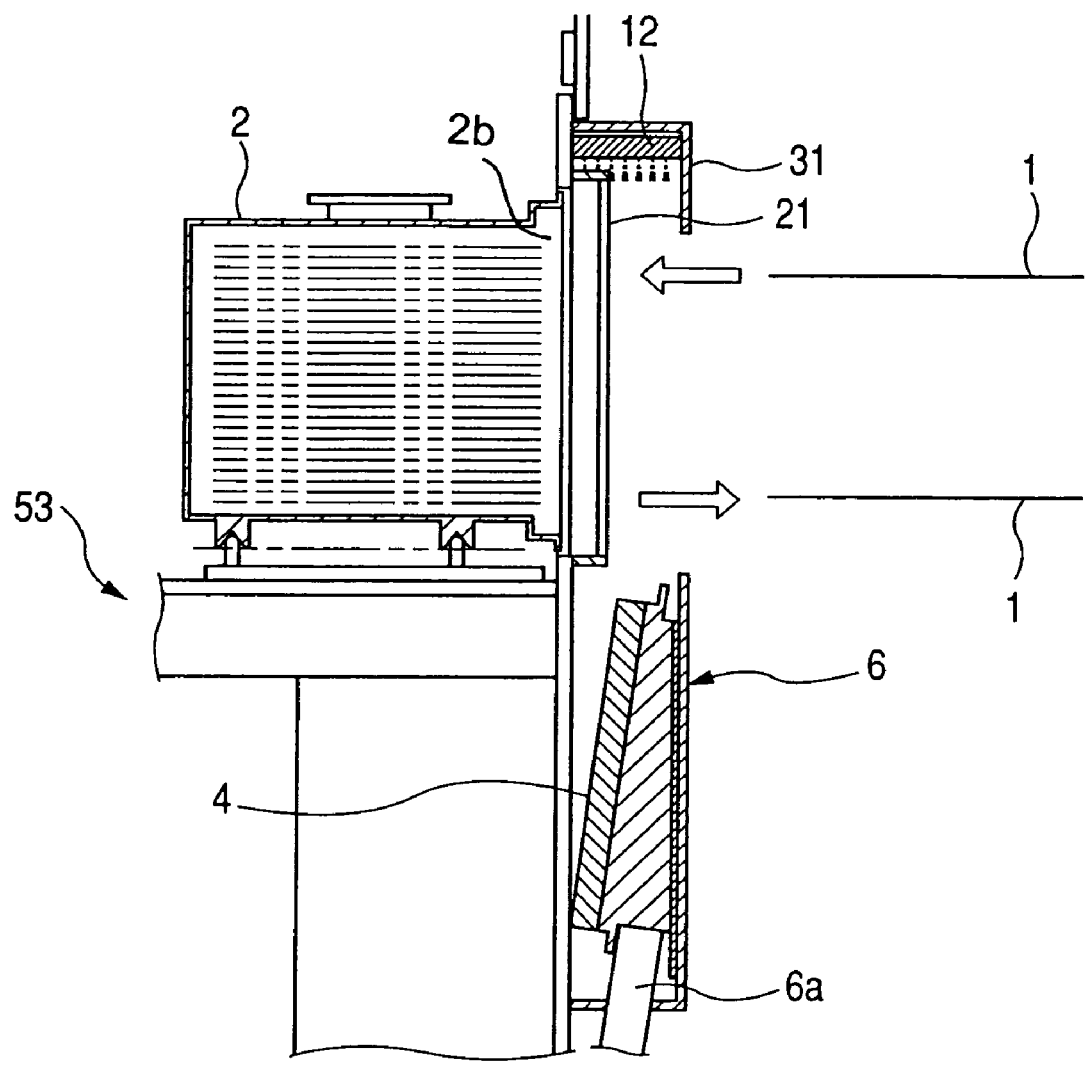
FIG. 4B shows a certain stage of the operation of opening or closing the lid by the lid opening and closing system shown in FIG. 1.

Subsequently, the door opening and closing mechanism 60 causes the door arm 6a to swing about the pivot 61 thereby bringing the door 6 into the retracted posture shown in FIG. 4A, whereby the pod 2 is partly opened to the second mini-environment 30. FIG. 4A and FIG. 4B referred to below illustrate the enclosure 31 and the portions relevant thereto as seen from the side in a similar manner as FIG. 2A. At that time, supply of the purge gas from the purge nozzles 21 is started. The door opening and closing mechanism 60 retract the door 6 in the retracted posture to the retracted position or the lowest position in the enclosure 31. FIG. 4B shows the door 6 kept at the retracted position. In this state, the opening 2b of the pod 2 is open, so that transfer of wafers 1 into/out of the interior of the pod 2 through the second mini-environment 31a by the transfer mechanism (not shown) provided in the 52 can be performed.

Figure 4C:
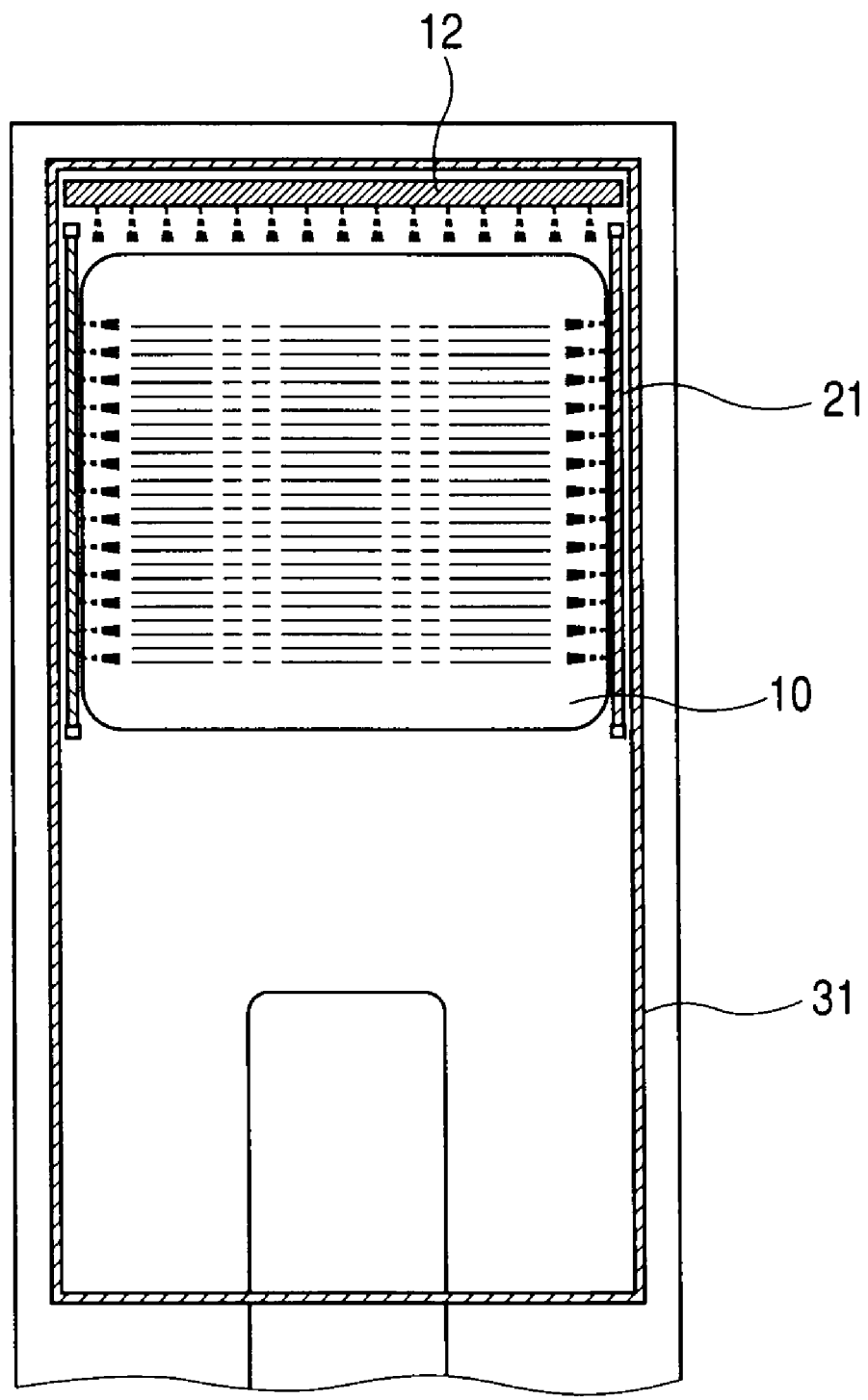
FIG. 4C shows, in the manner same as FIG. 2B, a view as seen from the mini-environment in the stage shown in FIG. 4B.

FIG. 4C schematically illustrates a view as seen from the mini-environment 52 in a similar manner as FIG. 2B. The curtain nozzle 12 supplies the gas same (in kind) as the purge gas in such a way to create downward gas flow parallel to the wall 11. The two purge nozzles 21 supply the purge gas in such a way as to direct the flow of the purge gas toward the center of the wafers 1 stored in the pod 2. Transfer of wafers 1 is performed in this state. During the wafer transfer operation, purging of the interior of the pod 2 is performed ceaselessly to keep the oxygen partial pressure in the interior of the pod 2 low. After transfer of the wafers 1 to be stored into the pod 2 has been completed, the lid closing operation is performed as follows.

In the closing operation, the door opening and closing mechanism 60 moves the door 6 upward to return it to the position shown in FIG. 4A at which the door 6 was brought into the retracted posture after swinging. In this state, the operation of the door opening and closing mechanism 60 is temporarily stopped, and the door 6 is maintained in the posture before swinging. In this state, the flat surface 6b on the rear side of the door 6 is nearly in close contact with the portion of the enclosure 31 that surrounds the second opening portion 31a to enhance the degree of closure of the second mini-environment 30. In addition, the lid 4 held by the door 6 is kept inclined relative to the gas curtain at a certain angle, whereby it deflects the gas flow to change its direction from the downward direction in the enclosure 31 to a direction toward the interior of the pod 2.

The increase in the degree of closure of the enclosure 31 facilitates an increase in the partial pressure of the purge gas in the space including the second mini-environment 30 and the interior space of the pod 2. Furthermore, since the curtain gas itself can be used to purge the interior of the pod 2, the efficiency of purging of the interior of the pod 2 can be further enhanced. After the state shown in FIG. 4A is maintained for a predetermined time whereby the quantity of oxidizing gases in the pod interior space has been sufficiently reduced by sufficient purging of the interior of the pod 2, the door opening and closing mechanism 60 swings the door 6 to close the pod opening 2a with the lid 4. By the above described operation, the wafers 1 can be enclosed in the pod 2 in which a low oxidizing gas concentration that cannot be realized by the conventional apparatuses is achieved.

In the above described operation, the door 6 is kept at the retracted position during the wafer transfer operation from the beginning to the end of the transfer of all the wafers. If purging of the interior of the pod 2 is to be performed quickly and effectively, it is necessary to supply a large amount of purge gas into the purged space to increase the pressure in that space to thereby remove the previously existing gas quickly. However, in the case where the second opening portion 31a is open as is the case in the above described operation, it is difficult to increase the pressure in the second mini-environment 30 extremely. Furthermore, if the second opening portion 31a is kept open for a long time, the partial pressure of the oxidizing gases in the interior of the pod 2 may gradually increase due to diffusion of the atmospheric air from the mini-environment 52. In such cases, it is preferred that the door 6 is moved upward from the retracted position to the position shown in FIG. 4A at which it substantially closes the second opening portion 31a every time transfer of a wafer 1 is performed to purge the second mini-environment 30 and the interior of the pod 2 while keeping them in a substantially closed state. This enables to effectively prevent an increase in the partial pressure of the oxidizing gases.

Although in the above described embodiment the curtain nozzle 12 has a rectangular parallelepipedal shape and gas ejection ports are provided all over its bottom surface, it is preferred that the shape, position, number or other features of the ejection ports be modified appropriately according to the flow rate of the gas supplied, the volume of the second mini-environment and/or other conditions: Similarly, it is preferred that the shape, position and other features of the purge nozzle 21 be modified appropriately. Although in the embodiment the door 6 is adapted to close the first opening portion 10 only nearly, the door 6 may close it completely. Although in the embodiment a punched metal plate having holes that serve as gas outlets opposed to the flow of the curtain gas is used as the bottom wall 31*b* of the enclosure, other structures, such as a meshed structure or a plate having slits, that do not prevent creation of the downward gas flow while providing a certain degree of exhaust resistance may be used in the bottom wall.

The amount of swinging of the door 6 is so designed that the flat surface 6*b* of the door 6 comes close to but not in contact with the wall around the second opening portion 31*a* of the enclosure 31, with a view to prevent generation of particles or the like. However, in cases where the second mini-environment 30 and the interior of the pod 2 are purged simultaneously, it is preferred that the interface of the flat surface 6*b* and the enclosure 31 be sealed. In such cases, the door 6 may be swung in two steps so that the door 6 is kept at different positions when purging is performed and when the door 6 is retracted respectively and the flat surface 6*b* and the enclosure 31 are temporarily kept in close contact with each other only during the purging operation. Alternatively, a seal member that can be inflated and deflated by, for example, introduction and exhaust of a fluid may be provided on the outer circumference of the flat surface 6*b*. In this case, the seal member may be inflated only during the purging operation so as to be brought into close contact with the enclosure 31 to achieve the above mentioned close contact, and it may be deflated so as to detach it from the enclosure 31.

Figure 5:
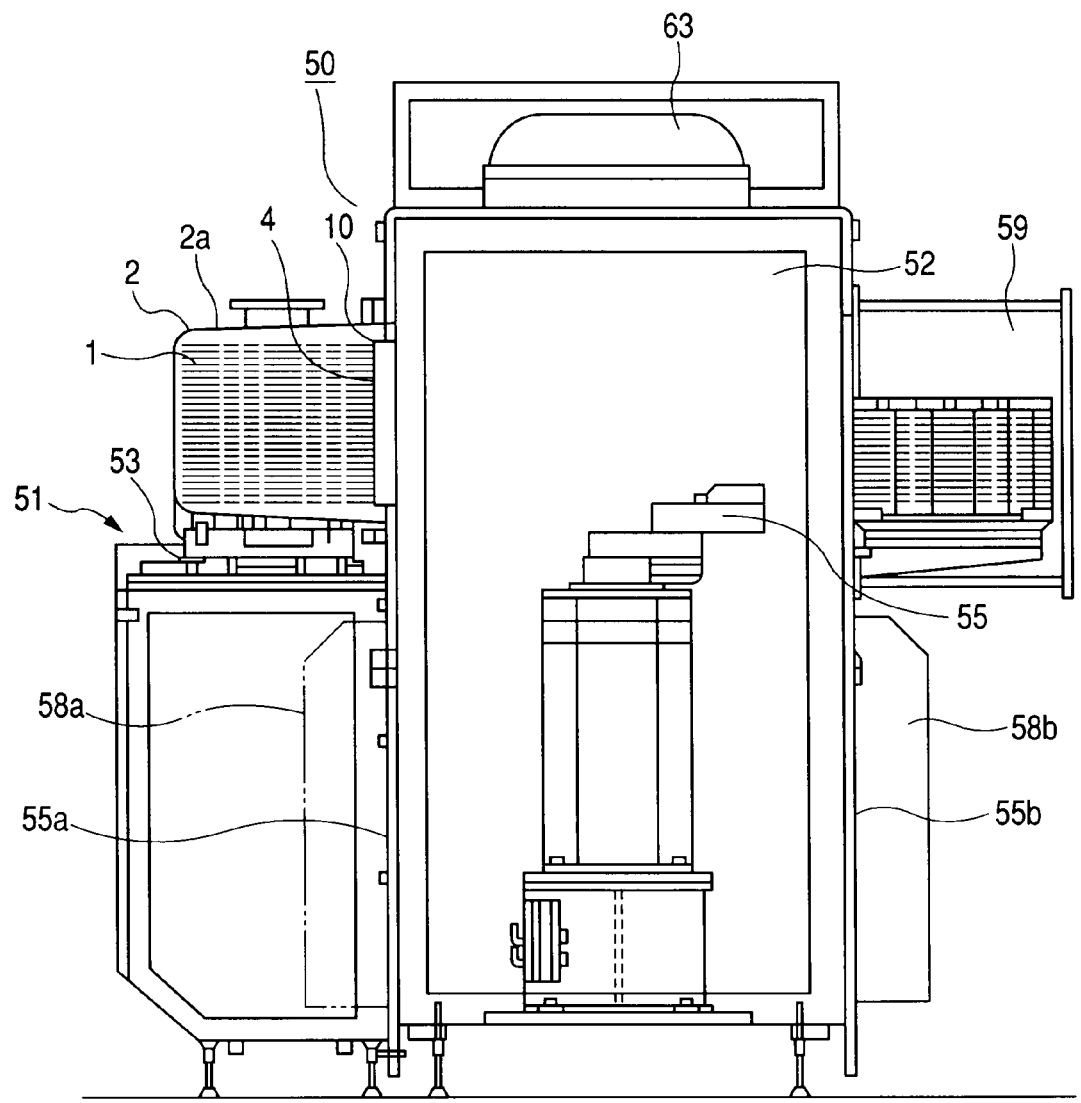
FIG. 5 is an overall side view of a general semiconductor wafer processing apparatus to which the present invention is applied.

In the following, a description will be made of an FIMS system as an actual lid opening and closing system in which the present invention is implemented and a semiconductor wafer processing apparatus using that system. FIG. 5 shows the general structure of the semiconductor wafer processing apparatus 50 accommodating to what is called the mini environment system. The semiconductor wafer processing apparatus 50 is composed mainly of a load port section (i.e. FIMS system, or lid opening and closing apparatus) 51, a transfer chamber (or mini-environment) 52 and a processing chamber 59. These sections are separated by a partition 55*a* and a cover 58*a* on the load port side and a partition 55*b* and a cover 58*b* on the processing chamber side. To keep a high degree of cleanness in the transfer chamber 52 of the semiconductor apparatus 50 by bringing out dusts, downward air flow from the upper portion to the lower portion of the transfer chamber is created in the transfer chamber 52 by a fan filter unit 63 provided in the upper portion thereof. In addition, exhaust passages for the downward air flow is provided on the bottom of the transfer chamber 52. By this equipment, dusts are always carried downwardly out to the exterior.

A pod 2 or a storage container for silicon wafers or the like (which will be simply referred to as wafers hereinafter) is mounted on a support table 53 of the load port 51. As described before, the interior of the transfer chamber 52 is kept highly clean to process the wafers 1. A robot arm 55 that can actually holds a wafer in the transfer mechanism is provided in the transfer chamber 52. The wafers are transferred between the interior of the pod 2 and the interior of the processing chamber 59 by the robot arm 55. In the processing chamber 59 are normally provided various processing apparatuses for performing processing such as deposition of a thin film on the wafer surface and processing of the thin film. Since they do not have direct relevancy to the present invention, they will not be described in further detail.

The pod 2 has a space to accommodate the wafers 1 as objects to be processed. The pod 2 has a substantially box-like body 2*a* having an opening on one lateral side thereof and a lid 4 for closing the opening of the body 2*a*. In the interior of the body 2*a* is provided a rack having a plurality of shelves on which wafers 1 are arranged one above another along one direction. The wafers 1 stored in the pod 2 are placed on the shelves at regular intervals. In this embodiment, the wafers 1 are arranged along the vertical direction. The transfer chamber 52 is provided with an opening portion 10 and the above described enclosure 31 on the load port 51 side. The opening portion 10 is arranged at a position opposed to the opening of the pod 2 when the pod 2 is disposed close to the opening portion 10 on the load port 5*l*. Since the components relevant to the present invention, such as the enclosure 31 and door 6, have already been described in detail in connection with the embodiment, further description and illustration thereof will be omitted to facilitate understanding of the drawings.

Figure 6A:
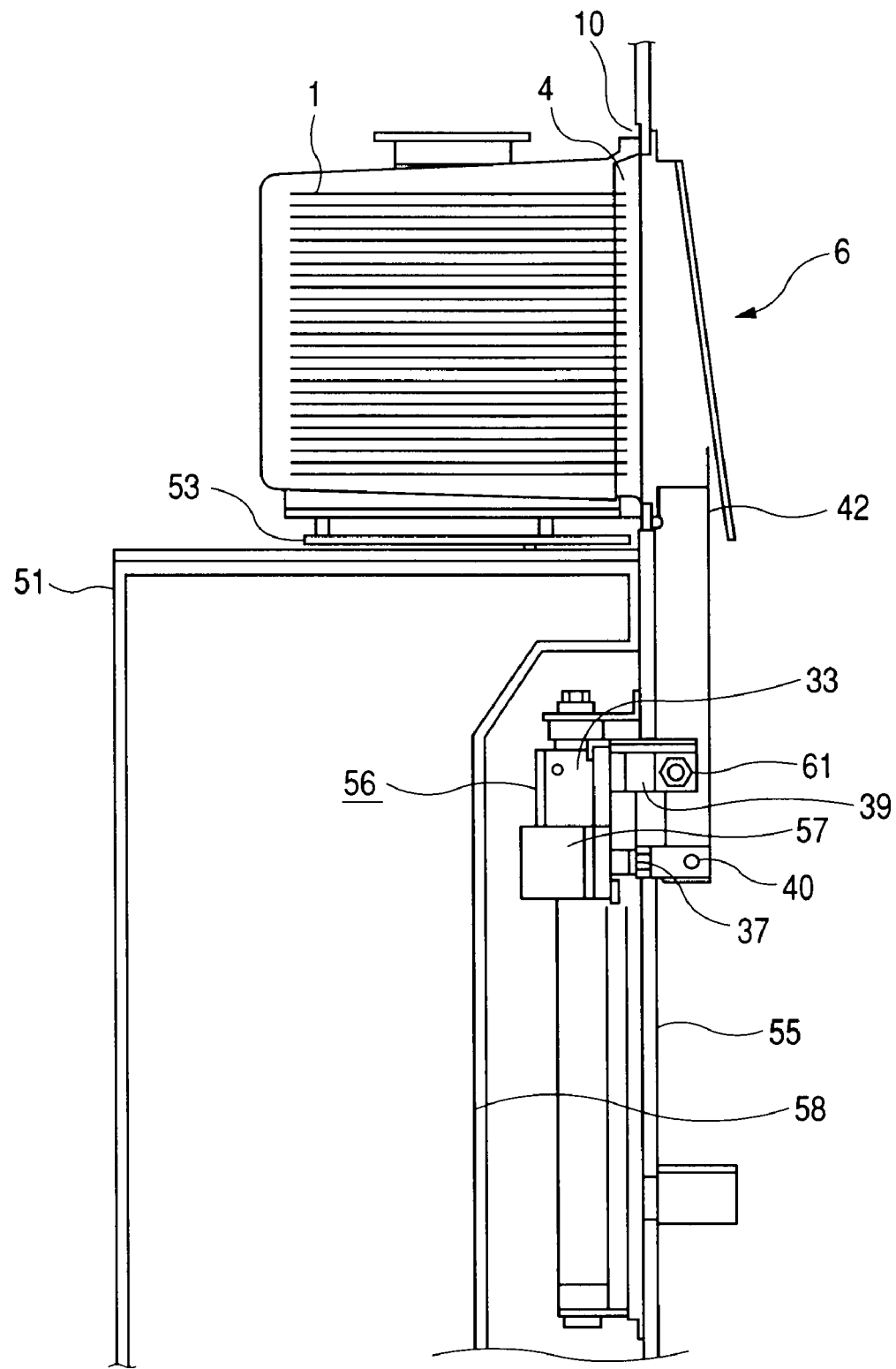
FIG. 6A is an enlarged side view schematically illustrating the door opening and closing mechanism and other component in the neighborhood thereof in the apparatus shown in FIG. 5.
Figure 6B:
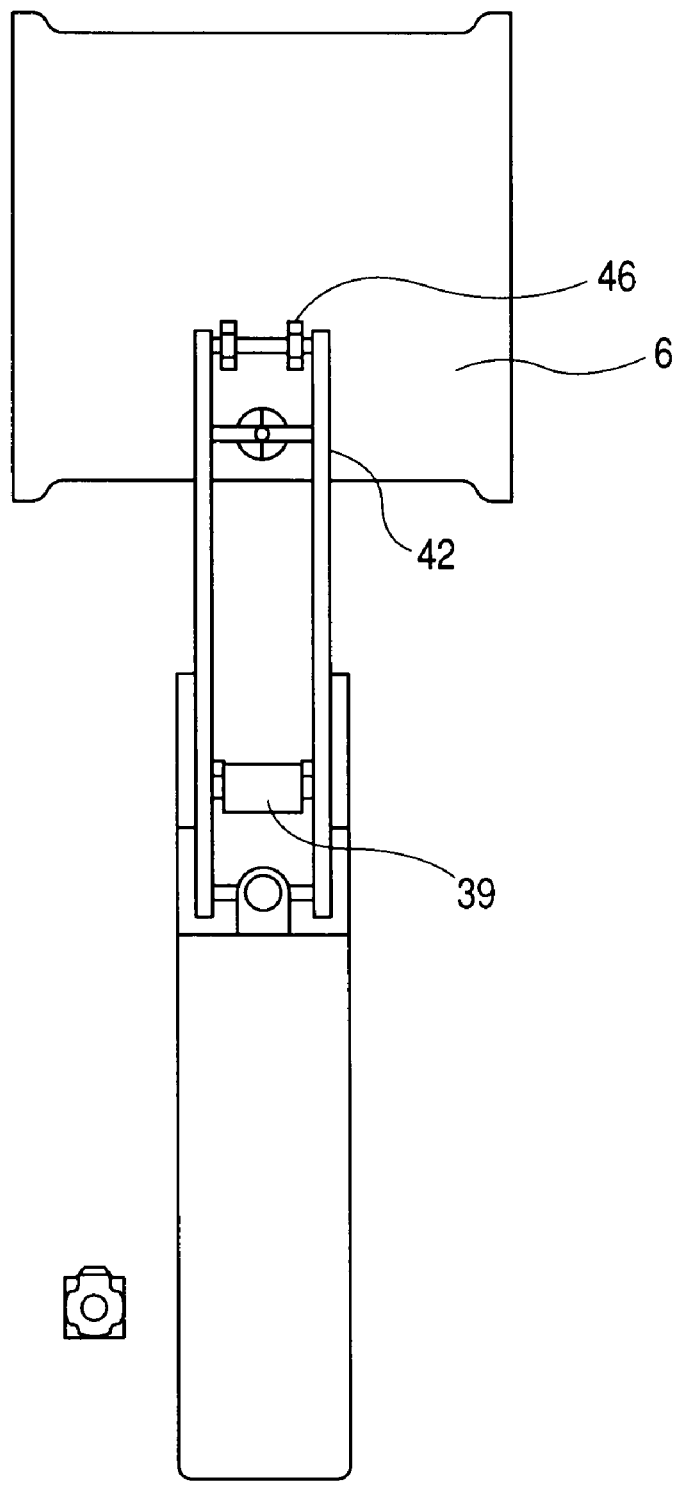
FIG. 6B schematically shows the structure shown in FIG. 6A as seen from the transfer chamber.
Figure 6C:
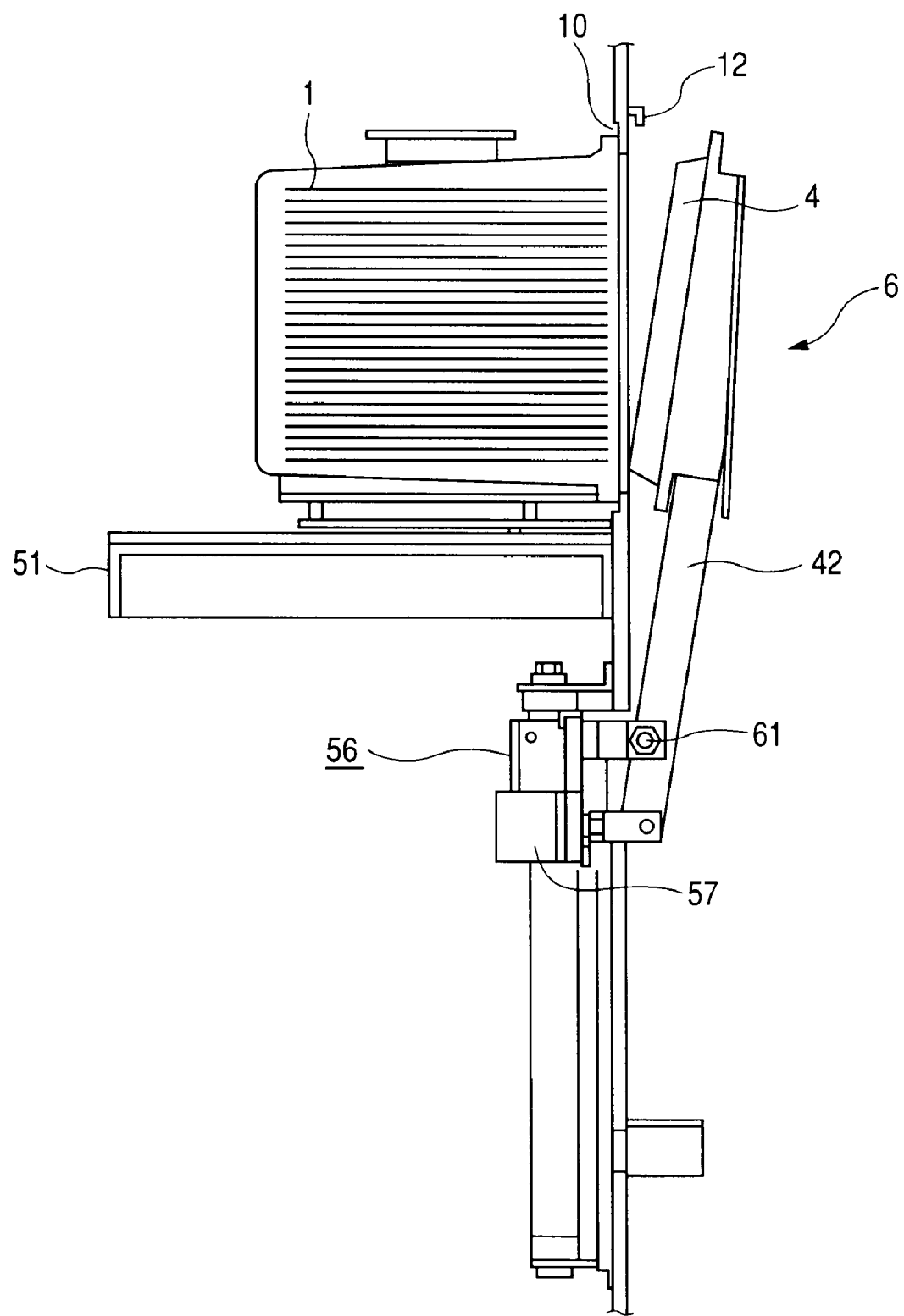
FIG. 6C shows, in the same manner as FIG. 6A, the structure shown in FIG. 6A in the state in which the lid has been detached from the pod by the door.

FIGS. 6A and 6B are an enlarged lateral cross sectional view of the door 6 and the door opening and closing mechanism 60 in this apparatus and a front view thereof as seen from the transfer chamber 52, respectively. FIG. 6C is a lateral cross sectional view schematically showing the state in which the lid 4 has been removed from the pod 2 by the door opening and closing mechanism 60. The door 6 is attached to one end of a door arm 42 (corresponding to an element designated by numeral 6*a* in the embodiment shown in FIG. 1 or the like) in a swingable manner by means of a securing member 46. The other end of the door arm 42 is supported on the end of a rod 37 that constitutes a portion of an air-driven cylinder 57 via a pivot shaft 40 so that it can swing about the pivot shaft 40.

The door arm 42 has a through hole at some position between the two ends. A pin (not shown) is inserted through this through hole and a hole provided on a fixing member 39 that is fixedly attached to a support member 60 for a movable portion 56 that moves the door opening/closing structure including the door arm 42 to provide a pivot 61. Thus, the door arm 42 can swing about the pivot 61 in accordance with the extension and retraction of the rod 37 driven by the cylinder 57. The pivot 61 of the door arm 42 is fixedly attached to the support member 60 provided on the movable portion that can move up and down.

When processing of the wafers 1 is to be performed in this apparatus, the pod 2 is placed on the support table 53 and set to a position close to the opening portion 10 of the transfer chamber, and the lid 4 is held by the door 6. Cooperative engagement mechanisms (not shown) are provided on the surface of the door 6 and the surface of the lid 4 respectively. The engagement mechanisms are actuated when the surface of the lid 4 and the surface of the door 6 are in contact with each other, whereby the lid 4 is held by the door 6. Then, the rod of the cylinder 57 is retracted, whereby the door arm 42 is swung about the pivot 61 so that the door 6 is moved away from the first opening portion 10. By this operation, the door 6 is swung together with the lid 4 to remove the lid 4 from the pod 2. The apparatus in this state is shown in FIG. 6C. Thereafter, the movable portion 56 is moved downward to bring the lid 4 to a predetermined retracted position. The wafer transfer operation has been described in detail in connection with the above described embodiment, and it will not be described in further detail.

Although the above described embodiment is directed to FOUP and FIMS systems, the applications of the present invention are not limited to them. The lid opening and closing apparatus according to the present invention can be applied to any front open type container in which a plurality of objects are to be stored and any system that opens/closes the lid of the container and transfers objects stored out of/into the container, to thereby keep the partial pressure of the oxidizing gases in the container low. In cases where a specific gas having desired characteristics other than inert gases is used as the gas with which the interior of the container is to be filled, the partial pressure of that specific gas in the container can be kept high by using the lid opening and closing system according to the present invention.

According to the present invention, isolation of the space by the enclosure is achieved, and entrance of gases in the container from the exterior upon supplying a purge gas by a gas curtain or the like can be advantageously reduced. Furthermore, increases in the partial pressure of oxidizing gases in the interior of the pod can be effectively prevented by supplying a purge gas to the wafers in addition to the curtain gas. The present invention can be applied to existing FIMS systems only by additionally providing an enclosure, a curtain nozzle, purge nozzle and other related equipment. These additional components can be added to standardized systems easily at low cost.

This application claims priority from Japanese Patent Application No. 2007-198618 filed on Jul. 31, 2007, which is hereby incorporated by reference herein.

What is claimed is:

1. A lid opening and closing system that detaches a lid of a storage container having a substantially box-like body having an opening on one side thereof that can store an object to be stored in the interior thereof and the lid that can be detached from said body and closes said opening to form a closed space in cooperation with said body, to open said opening thereby enabling to bring said object to be stored into/out of said storage container, comprising:
   a support table on which said storage container is to be placed;
   a mini-environment disposed adjacent to said support table in which a mechanism for transferring said object to be stored under particle control is housed;
   a first opening portion having a substantially rectangular shape formed on a wall adjacent to said support table that defines a part of said mini-environment, said first opening portion being provided at a position at which it can be just opposed to said opening of said storage container that is placed on said support table;
   a door that can hold said lid and substantially close said first opening portion, said door bringing said opening and said first opening portion into communication by opening said first opening portion while holding said lid;
   an enclosure provided in said mini-environment continuously with said first opening portion to enclose a space in which the door moves and define a second mini-environment, said enclosure having a second opening portion that allows communication between said first opening portion and said mini-environment and through which said mechanism for transferring said object to be stored can pass together with said object to be stored; and
   a curtain nozzle disposed above the upper edge of said first opening portion in said enclosure, said curtain nozzle being able to supply a specific gas along a direction from said upper edge to the lower edge of said first opening portion,
   wherein said enclosure has a gas outlet through which said gas can flow out into said mini-environment along the direction of said gas flow, and
   wherein said door can substantially close the second opening portion by its surface opposite to the surface that closes said first opening portion.

2. The system according to claim 1, further comprising purge nozzles that can supply a gas in a direction toward the interior of said storage container, said purge nozzles being disposed outside side edges of said first opening portion in said second mini-environment.

3. The system according to claim 2, wherein the direction of gas supply by said purge nozzle is a direction toward a surface of said object, that is different from the direction of gas supply from the curtain nozzle and toward a certain point equidistant from said purge nozzles in said plane.

4. The system according to claim 1, wherein said surface or a member embedded in said surface can come in contact with a portion of said enclosure defining said second opening portion around it to enhance the degree of closure of said second mini-environment.

5. The system according to claim 1, wherein said door is swung from a position at which it closes the first opening portion upon substantially closing the second opening portion, and the gas supplied from the curtain nozzle can be introduced into the storage container in the state in which said second opening portion is closed by said door.

6. The system according to claim 1, further comprising:
   a door opening and closing mechanism causes said door to swing about a pivot and to take a retracted posture for closing said second opening portion, and moves said door to the position to open said first opening portion and said second opening portion, and
   wherein said door closes said second opening portion by its surface of a rear side surface of said door opposite to a surface for closing said first opening portion, and said rear side surface of said door is provided to incline with respect to the surface of said door for closing said first opening portion.

7. A lid opening and closing system that detaches a lid of a storage container having a substantially box-like body having an opening on one side thereof that can store an object to be stored in the interior thereof and the lid that can be detached from said body and closes said opening to form a closed space in cooperation with said body, to open said opening thereby enabling to bring said object to be stored into/out of said storage container, comprising:
   a support table on which said storage container is to be placed;
   a mini-environment disposed adjacent to said support table in which a mechanism for transferring said object to be stored under particle control is housed;
   a first opening portion having a substantially rectangular shape formed on a wall adjacent to said support table that defines a part of said mini-environment, said first opening portion being provided at a position at which it can be just opposed to said opening of said storage container that is placed on said support table;
   a door that can hold said lid and substantially close said first opening portion, said door bringing said opening and said first opening portion into communication by opening said first opening portion while holding said lid;
   an enclosure provided in said mini-environment continuously with said first opening portion to enclose a space in which the door moves and define a second mini-environment, said enclosure having a second opening portion that allows communication between said first opening portion and said mini-environment and through which said mechanism for transferring said object to be stored can pass together with said object to be stored;
   a curtain nozzle disposed above the upper edge of said first opening portion in said enclosure, said curtain nozzle being able to supply a specific gas along a direction from said upper edge to the lower edge of said first opening portion; and
   purge nozzles that can supply a gas in a direction toward the interior of said storage container, said purge nozzles being disposed outside a right side edge and a left side edge of said first opening portion in said second mini-environment, wherein said enclosure has a gas outlet through which said gas can flow out into said mini-environment along the direction of said gas flow, and said door is swung from a position at which it closes the first opening portion upon substantially closing the second opening portion, and the gas supplied from the curtain nozzle can be introduced into the storage container in the state in which said second opening portion is closed by said door.

8. The system according to claim 7, wherein the direction of gas supply by said purge nozzle is a direction toward a surface of said object, that is different from the direction of gas supply from the curtain nozzle and toward a certain point equidistant from said purge nozzles in said plane.

9. A lid opening and closing system that detaches a lid of a storage container having a substantially box-like body having an opening on one side thereof that can store an object to be stored in the interior thereof and the lid that can be detached from said body and closes said opening to form a closed space in cooperation with said body, to open said opening thereby enabling to bring said object to be stored into/out of said storage container, comprising:
   a support table on which said storage container is to be placed;
   a mini-environment disposed adjacent to said support table in which a mechanism for transferring said object to be stored under particle control is housed;
   a first opening portion having a substantially rectangular shape formed on a wall adjacent to said support table that defines a part of said mini-environment, said first opening portion being provided at a position at which it can be just opposed to said opening of said storage container that is placed on said support table;
   a door that can hold said lid and substantially close said first opening portion, said door bringing said opening and said first opening portion into communication by opening said first opening portion while holding said lid;
   an enclosure provided in said mini-environment continuously with said first opening portion to enclose a space in which the door moves and define a second mini-environment, said enclosure having a second opening portion that allows communication between said first opening portion and said mini-environment and through which said mechanism for transferring said object to be stored can pass together with said object to be stored;
   a curtain nozzle disposed above the upper edge of said first opening portion in said enclosure, said curtain nozzle being able to supply a specific gas along a direction from said upper edge to the lower edge of said first opening portion; and
   purge nozzles that can supply a gas in a direction toward the interior of said storage container, said purge nozzles being disposed outside a right side edge and a left side edge of said first opening portion in said second mini-environment,
   wherein said enclosure has a gas outlet through which said gas can flow out into said mini-environment along the direction of said gas flow, and a seal member is provided on said door to closely contact with said enclosure at a periphery of said second opening portion at a time when said door takes a retracted posture for closing said second opening portion.

10. A lid opening and closing system that detaches a lid of a storage container having a substantially box-like body having an opening on one side thereof that can store an object to be stored in the interior thereof and the lid that can be detached from said body and closes said opening to form a closed space in cooperation with said body, to open said opening thereby enabling to bring said object to be stored into/out of said storage container, comprising:
   a support table on which said storage container is to be placed;
   a mini-environment disposed adjacent to said support table in which a mechanism for transferring said object to be stored under particle control is housed;
   a first opening portion having a substantially rectangular shape formed on a wall adjacent to said support table that defines a part of said mini-environment, said first opening portion being provided at a position at which it can be just opposed to said opening of said storage container that is placed on said support table;
   a door that can hold said lid and substantially close said first opening portion, said door bringing said opening and said first opening portion into communication by opening said first opening portion while holding said lid;
   an enclosure provided in said mini-environment continuously with said first opening portion to enclose a space in which the door moves and separate said mini-environment into a system space in which said mechanism for transferring said object to be stored is located and a second mini-environment, said enclosure having a second opening portion that allows communication between said system space and said second mini-environment and through which said mechanism for transferring said object to be stored can pass together with said object to be stored;
   a door opening and closing mechanism that causes said door to swing about a pivot and to take said retracted posture, and moves said door to the position to open said first opening portion and said second opening portion; and
   a curtain nozzle disposed above the upper edge of said first opening portion in said enclosure, said curtain nozzle being able to supply a specific gas along a direction from said upper edge to the lower edge of said first opening portion,
   wherein said enclosure has a gas outlet through which said gas can flow out into said mini-environment along the direction of said gas flow, and
   wherein said door opening and closing mechanism causes said door to open said first opening portion such that said door takes a retracted posture for closing said second opening portion, and causes the door to move vertically to a position to open said second opening portion while keeping said retracted posture, so as to make it possible to transfer said object through said first opening portion and said second opening portion.

11. The system according to claim 10,
   wherein a rear side surface of said door opposite to a surface for closing said first opening portion is set closer to said second opening portion as the door extends away from the curtain nozzle at a time when said door closes said first opening portion so that said door closes said second opening portion by said rear side surface of said door.

12. The system according to claim 10, wherein a seal member is provided on said door to closely contact with said enclosure at a periphery of said second opening portion at a time when said door takes said retracted posture for closing said second opening portion.

* * * * *